US012753301B2

(12) United States Patent
Watanabe et al.

(10) Patent No.: US 12,753,301 B2
(45) Date of Patent: Oct. 6, 2026

(54) RESIN COMPOSITION, PREPREG, FILM PROVIDED WITH RESIN, METAL FOIL PROVIDED WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Rihoko Watanabe, Osaka (JP); Hirosuke Saito, Osaka (JP); Hiroaki Umehara, Fukushima (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 647 days.

(21) Appl. No.: 18/025,150

(22) PCT Filed: Sep. 9, 2021

(86) PCT No.: PCT/JP2021/033120

§ 371 (c)(1),
(2) Date: Mar. 7, 2023

(87) PCT Pub. No.: WO2022/054862

PCT Pub. Date: Mar. 17, 2022

(65) Prior Publication Data

US 2023/0323104 A1 Oct. 12, 2023

(30) Foreign Application Priority Data

Sep. 11, 2020 (JP) ................................ 2020-153179

(51) Int. Cl.

| | |
|---|---|
| ***C08L 53/00*** | (2006.01) |
| ***C08J 5/24*** | (2006.01) |
| ***C08J 7/04*** | (2020.01) |
| ***C08K 3/36*** | (2006.01) |
| ***C08K 5/3415*** | (2006.01) |
| ***H05K 1/03*** | (2006.01) |

(52) U.S. Cl.

CPC ............... *C08L 53/00* (2013.01); *C08J 5/246* (2021.05); *C08J 7/0427* (2020.01); *C08K 3/36* (2013.01); *C08K 5/3415* (2013.01); *H05K 1/0353* (2013.01); *C08J 2325/06* (2013.01); *C08L 2203/16* (2013.01)

(58) Field of Classification Search

CPC ..... C08L 53/00; C08K 3/36; C08J 5/24; C08J 7/04

USPC ........................................................... 524/68

See application file for complete search history.

(56) References Cited

U.S. PATENT DOCUMENTS

| | | | | |
|---|---|---|---|---|
| 5,399,715 | A | 3/1995 | Naitoh et al. | |
| 5,834,559 | A * | 11/1998 | Deguchi | C08L 23/10 524/217 |
| 2005/0038186 | A1 | 2/2005 | Morikawa et al. | |
| 2008/0182939 | A1 | 7/2008 | Morikawa et al. | |
| 2015/0183969 | A1* | 7/2015 | Tanaka | F16F 15/08 524/505 |
| 2019/0241729 | A1 | 8/2019 | Tanigawa et al. | |
| 2020/0001573 | A1 | 1/2020 | Saito et al. | |
| 2021/0214547 | A1* | 7/2021 | Honda | C08L 53/02 |
| 2021/0229407 | A1 | 7/2021 | Higashita et al. | |
| 2021/0261736 | A1 | 8/2021 | Kuboki et al. | |
| 2023/0098357 | A1* | 3/2023 | Hirano | C08J 5/249 428/209 |

FOREIGN PATENT DOCUMENTS

| | | | | |
|---|---|---|---|---|
| CN | 1693352 | A | 11/2005 | |
| JP | 2003-171511 | A | 6/2003 | |
| JP | 2018-131519 | A | 8/2018 | |
| WO | 93/012933 | A1 | 7/1993 | |
| WO | 2018/016489 | | 1/2018 | |
| WO | 2018/159080 | A1 | 9/2018 | |
| WO | 2019/230943 | A1 | 12/2019 | |
| WO | WO-2019230945 | A1 * | 12/2019 | B32B 15/14 |
| WO | 2020/054601 | A1 | 3/2020 | |
| WO | WO-2021149733 | A1 * | 7/2021 | C08L 79/085 |

OTHER PUBLICATIONS

ISR issued in International Patent Application No. PCT/JP2021/033120, Nov. 9, 2021, translation.

* cited by examiner

*Primary Examiner* — Deve V Hall
(74) *Attorney, Agent, or Firm* — GREENBLUM & BERNSTEIN, P.L.C.

(57) ABSTRACT

A resin composition contains a maleimide compound (A) having an arylene structure bonded in the meta-orientation in the molecule, and a styrenic polymer being solid at 25° C.

18 Claims, 5 Drawing Sheets

RESIN COMPOSITION, PREPREG, FILM PROVIDED WITH RESIN, METAL FOIL PROVIDED WITH RESIN, METAL-CLAD LAMINATE, AND WIRING BOARD

TECHNICAL FIELD

The present invention relates to a resin composition, a prepreg, a film with resin, a metal foil with resin, a metal-clad laminate, and a wiring board.

BACKGROUND ART

As the information processing quantity by various kinds of electronic equipment increases, mounting technologies such as high integration of semiconductor devices to be mounted, densification of wiring, and multilayering are progressing. In addition, wiring boards used in various kinds of electronic equipment are required to be, for example, high-frequency compatible wiring boards such as a millimeter-wave radar board for in-vehicle use. Substrate materials for forming insulating layers of wiring boards used in various kinds of electronic equipment are required to have a low relative dielectric constant and a low dielectric loss tangent in order to increase the signal transmission speed and to decrease the signal transmission loss. Examples of such substrate materials include resin compositions containing polyphenylene ether.

Examples of such resin compositions containing polyphenylene ether include the resin composition described in Patent Literature 1. Patent Literature 1 describes a resin composition containing a polyphenylene ether resin, an elastomer having an SP value of 9 $(cal/cm^3)^{1/2}$ or less and a weight average molecular weight of 80000 or more and being solid at 25° C., and an elastomer having an SP value of 9 $(cal/cm^3)^{1/2}$ or less and a weight average molecular weight of 40000 or less and being liquid at 25° C. According to Patent Literature 1, it is disclosed that it is possible to provide a resin composition, which is excellent in handleability in the process of forming a laminate by being laminated with other laminates, is unlikely to warp or crack, and further exhibits properties, such as heat resistance after moisture absorption, peel strength, electrical properties, dimensional stability, and moldability, suitable for printed wiring boards for high multilayering and high frequencies.

Metal-clad laminates and metal foils with resin used in the manufacture of wiring boards and the like include not only an insulating layer but also a metal foil on the insulating layer. Wiring boards also include not only an insulating layer but also wiring on the insulating layer. Examples of the wiring include wiring derived from a metal foil equipped in the metal-clad laminate or the like.

In recent years, particularly small portable devices such as mobile communication terminals and notebook PCs have been rapidly becoming multi-functional, high performance, slim and compact. Along with this, in wiring boards used in these products as well, there is a further demand for miniaturization of conductor wiring, multilayering of conductor wiring layers, thinning, and improvement in performance such as mechanical properties. For this reason, in the wiring boards, miniaturized wiring is also required not to peel off from the insulating layers and thus it is further required that adhesive properties between the wiring and the insulating layers are high. Hence, it is required that adhesive properties between the metal foils and the insulating layers are high in metal-clad laminates and metal foils with resin, and substrate materials for forming insulating layers of wiring boards are required to afford cured products exhibiting excellent adhesive properties to metal foils.

Wiring boards used in various kinds of electronic equipment are required to be hardly affected by changes in the external environment, and the like. For example, insulating layers of wiring boards are required to suitably maintain low dielectric properties even at a relatively high temperature so that the wiring board can also be used in a high temperature environment. Hence, substrate materials for forming insulating layers of wiring boards are required to afford cured products in which increases in relative dielectric constant and dielectric loss tangent due to temperature rise are sufficiently suppressed. It is also required that insulating layers of wiring boards do not deform even in a relatively high temperature environment. Since this deformation is suppressed when the glass transition temperature of insulating layers is high, the substrate materials for forming insulating layers of wiring boards are required to have a high glass transition temperature.

CITATION LIST

Patent Literature

Patent Literature 1: JP 2018-131519 A

SUMMARY OF INVENTION

The present invention has been made in view of such circumstances, and an object thereof is to provide a resin composition that affords a cured product, which exhibits excellent low dielectric properties and adhesive properties to a metal foil, has a high glass transition temperature, and sufficiently suppressed increases in relative dielectric constant and dielectric loss tangent due to temperature rise. Another object of the present invention is to provide a prepreg, a film with resin, a metal foil with resin, a metal-clad laminate, and a wiring board, which are obtained using the resin composition.

An aspect of the present invention is a resin composition containing a maleimide compound (A) having an arylene structure bonded in the meta-orientation in the molecule, and a styrenic polymer being solid at 25° C.

DESCRIPTION OF EMBODIMENTS

Figure 1:
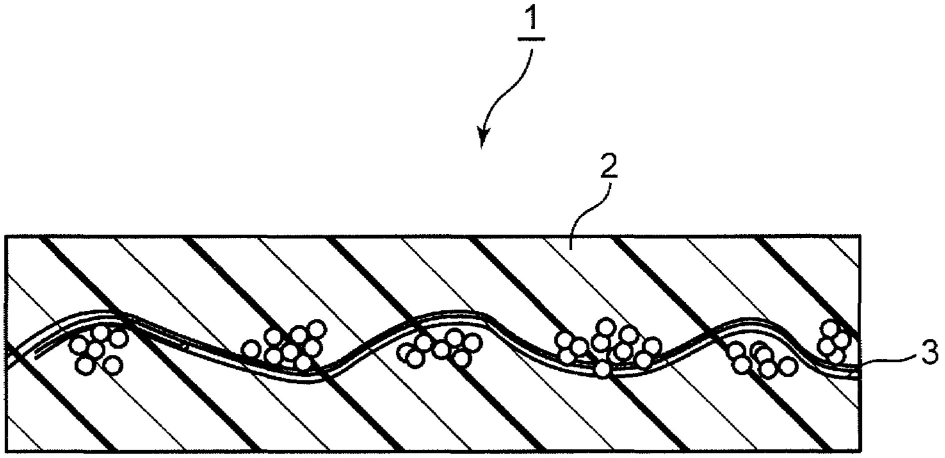
FIG. 1 is a schematic sectional view illustrating an example of a prepreg according to an embodiment of the present invention.

The present inventors have found out that the objects are achieved by the present invention described below as a result of extensive studies.

Hereinafter, embodiments according to the present invention will be described, but the present invention is not limited thereto.

[Resin Composition]

The resin composition according to the present embodiment is a resin composition containing a maleimide compound (A) having an arylene structure bonded in the meta-orientation in the molecule, and a styrenic polymer being solid at 25° C. By curing a resin composition having such a configuration, there is obtained a cured product, which exhibits excellent low dielectric properties and adhesive properties to a metal foil, has a high glass transition temperature, and sufficiently suppressed increases in relative dielectric constant and dielectric loss tangent due to temperature rise.

First, it is considered that the resin composition can be suitably cured by curing the styrenic polymer together with the maleimide compound (A), and a cured product is obtained which exhibits low dielectric properties, high adhesive properties to a metal foil, and a high glass transition temperature. It is considered that it is possible to sufficiently suppress increases in relative dielectric constant and dielectric loss tangent due to temperature rise of a cured product obtained by curing the resin composition as the maleimide compound (A) is used. From these facts, it is considered that the resin composition affords a cured product, which exhibits excellent low dielectric properties and adhesive properties to a metal foil, has a high glass transition temperature, and sufficiently suppressed increases in relative dielectric constant and dielectric loss tangent due to temperature rise.

(Maleimide Compound (A))

The maleimide compound (A) is not particularly limited as long as it is a maleimide compound having an arylene structure bonded in the meta-orientation in the molecule. Examples of the arylene structure bonded in the meta-orientation include an arylene structure in which a structure containing a maleimide group is bonded at the meta position (an arylene structure in which a structure containing a maleimide group is substituted at the meta position). The arylene structure bonded in the meta-orientation is an arylene group bonded in the meta-orientation, such as a group represented by the following Formula (3). Examples of the arylene structure bonded in the meta-orientation include m-arylene groups such as a m-phenylene group and a m-naphthylene group, and more specific examples thereof include a group represented by the following Formula (3).

[Chem. 1]

(3)

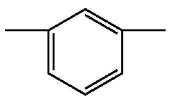

Examples of the maleimide compound (A) include a maleimide compound (A1) represented by the following Formula (1), and more specific examples thereof include a maleimide compound (A2) represented by the following Formula (2).

[Chem. 2]

(1)

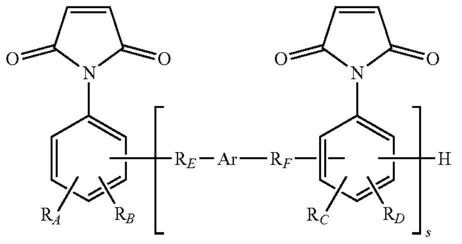

In Formula (1), $Ar_1$ represents an arylene group bonded in the meta-orientation. $R_A$, $R_B$, $R_C$, and $R_D$ are independent of each other. In other words, $R_A$, $R_B$, $R_C$, and $R_D$ may be the same group as or different groups from each other. $R_A$, $R_B$, $R_C$, and $R_D$ represent a hydrogen atom, an alkyl group having 1 to 5 carbon atoms, or a phenyl group, preferably a hydrogen atom. $R_E$ and $R_F$, are independent of each other. In other words, $R_E$ and $R_F$ may be the same group as or different groups from each other. $R_E$ and $R_F$ represent an aliphatic hydrocarbon group. s represents 1 to 5.

The arylene group is not particularly limited as long as it is an arylene group bonded in the meta-orientation, examples thereof include m-arylene groups such as a m-phenylene group and a m-naphthylene group, and more specific examples thereof include a group represented by Formula (3).

Examples of the alkyl group having 1 to 5 carbon atoms include a methyl group, an ethyl group, a propyl group, an isopropyl group, a n-butyl group, a sec-butyl group, an isobutyl group, a tert-butyl group, a pentyl group, and a neopentyl group.

The aliphatic hydrocarbon group is a divalent group and may be acyclic or cyclic. Examples of the aliphatic hydrocarbon group include an alkylene group, and more specific examples thereof include a methylene group, a methylmethylene group, and a dimethylmethylene group. Among these, a dimethylmethylene group is preferable.

In the maleimide compound (A1) represented by Formula (1), s, which is the number of repetitions, is preferably 1 to 5. This s is the average value of the number of repetitions (degree of polymerization).

[Chem. 3]

(2)

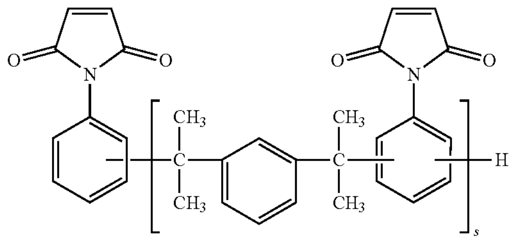

In Formula (2), s represents 1 to 5. This s is the same as s in Formula (1) and is the average value of the number of repetitions (degree of polymerization).

As long as s, which is the average value of the number of repetitions (degree of polymerization), is 1 to 5, the maleimide compound (A1) represented by Formula (1) and the maleimide compound (A2) represented by Formula (2) may include a monofunctional form in which s is 0 or a polyfunctional form such as a heptafunctional form or an octafunctional form in which s is 6 or more.

As the maleimide compound (A), a commercially available product can be used, and for example, the solid component in MIR-5000-60T manufactured by Nippon Kayaku Co., Ltd. may be used.

As the maleimide compound (A), the maleimide compounds exemplified above may be used singly or in combination of two or more kinds thereof. As the maleimide compound (A), the maleimide compound (A1) represented by Formula (1) may be used singly or the maleimide compound (A1) represented by Formula (1) may be used in combination of two or more kinds thereof. Examples of the combined use of two or more kinds of the maleimide compound (A1) represented by Formula (1) include concurrent use of the maleimide compound (A1) represented by Formula (1) other than the maleimide compound (A2) represented by Formula (2) with the maleimide compound (A2) represented by Formula (2).

(Styrenic Polymer)

The styrenic polymer is not particularly limited as long as it is a styrenic polymer being solid at 25° C. Examples of the styrenic polymer include styrenic polymers that are solid at 25° C. and can be used as resins contained in resin compositions used for forming insulating layers of metal-clad laminates, wiring boards and the like, and the like. The resin compositions used for forming insulating layers of metal-clad laminates, wiring boards and the like may be resin compositions used for forming resin layers of films with resin, metal foils with resin and the like, or may be a resin composition contained in prepregs. Since the styrenic polymer is solid at 25° C., it is possible to enhance the adhesive properties to a metal foil.

The styrenic polymer is, for example, a polymer obtained by polymerizing a monomer including a styrenic monomer, and may be a styrenic copolymer. Examples of the styrenic copolymer include a copolymer obtained by copolymerizing one or more styrenic monomers and one or more other monomers copolymerizable with the styrenic monomers. The styrenic copolymer may be a random copolymer or a block copolymer as long as it has a structure derived from the styrenic monomer in the molecule. Examples of the block copolymer include a bipolymer of the structure (repeating unit) derived from the styrenic monomer and the other copolymerizable monomer (repeating unit) and a terpolymer of the structure (repeating unit) derived from the styrenic monomer, the other copolymerizable monomer (repeating unit), and the structure (repeating unit) derived from the styrenic monomer. The styrenic polymer may be a hydrogenated styrenic copolymer obtained by hydrogenating the styrenic copolymer.

The styrenic monomer is not particularly limited, but examples thereof include styrene, a styrene derivative, one in which some hydrogen atoms of the benzene ring in styrene are substituted with an alkyl group, one in which some hydrogen atoms of the vinyl group in styrene are substituted with an alkyl group, vinyltoluene, α-methylstyrene, butylstyrene, dimethylstyrene, and isopropenyltoluene. As the styrenic monomer, these may be used singly or in combination of two or more kinds thereof. The other copolymerizable monomer is not particularly limited, but examples thereof include olefins such as α-pinene, β-pinene, and dipentene, unconjugated dienes such as 1,4-hexadiene and 3-methyl-1,4-hexadiene, and conjugated dienes such as 1,3-butadiene and 2-methyl-1,3-butadiene (isoprene). As the other copolymerizable monomer, these may be used singly or in combination of two or more kinds thereof.

As the styrenic polymer, conventionally known ones can be widely used, the styrenic polymer is not particularly limited, but examples thereof include a polymer having a structural unit represented by the following Formula (4) (a structure derived from the styrenic monomer) in the molecule.

[Chem. 4]

(4)

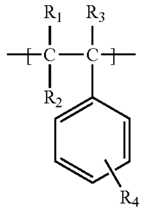

In Formula (4), $R_1$ to $R_3$ each independently represent a hydrogen atom or an alkyl group, and $R_4$ represents any group selected from the group consisting of a hydrogen atom, an alkyl group, an alkenyl group, and an isopropenyl group. The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group. The alkenyl group is preferably an alkenyl group having 1 to 10 carbon atoms.

The styrenic polymer preferably contains at least one structural unit represented by Formula (4), and may contain two or more different structural units in combination. The styrenic polymer may contain a structure in which the structural unit represented by Formula (4) is repeated.

In addition to the structural unit represented by Formula (4), the styrenic polymer may have at least one among structural units represented by the following Formula (5), the following Formula (6), and the following Formula (7) and structures in which structural units represented by the following Formula (5), the following Formula (6), and the following Formula (7) are each repeated as a structural unit derived from another monomer copolymerizable with the styrenic monomer.

[Chem. 5]

(5)

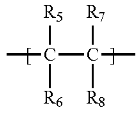

[Chem. 6]

(6)

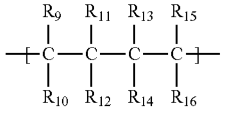

[Chem. 7]

(7)

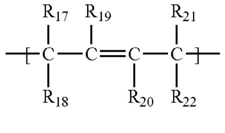

In Formula (5), Formula (6), and Formula (7), $R_5$ to $R_{22}$ each independently represent any group selected from the group consisting of a hydrogen atom, an alkyl group, an alkenyl group, and an isopropenyl group. The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group. The alkenyl group is preferably an alkenyl group having 1 to 10 carbon atoms.

The styrenic polymer preferably contains at least one among the structural units represented by Formula (5), Formula (6), and Formula (7), and may contain two or more different structural units among these in combination. The styrenic polymer may have at least one among structures in which the structural units represented by Formula (5), Formula (6), and Formula (7) are each repeated.

More specific examples of the structural unit represented by Formula (4) include structural units represented by the following Formulas (8) to (10). The structural unit represented by Formula (4) may be structures in which structural units represented by the following Formulas (8) to (10) are each repeated, and the like. The structural unit represented by Formula (4) may be one structural unit among these or a combination of two or more different structural units.

[Chem. 8]

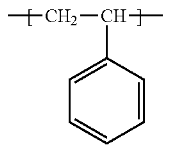

(8)

[Chem. 9]

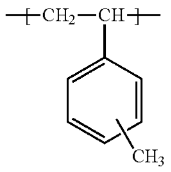

(9)

[Chem. 10]

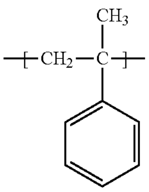

(10)

More specific examples of the structural unit represented by Formula (5) include structural units represented by the following Formulas (11) to (17). The structural unit represented by Formula (5) may be structures in which structural units represented by the following Formulas (11) to (17) are each repeated, and the like. The structural unit represented by Formula (5) may be one structural unit among these or a combination of two or more different structural units.

[Chem. 11]

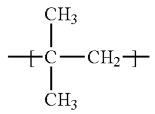

(11)

[Chem. 12]

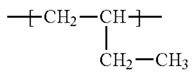

(12)

[Chem. 13]

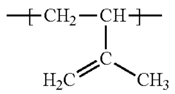

(13)

[Chem. 14]

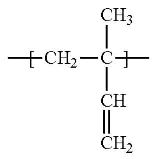

(14)

[Chem. 15]

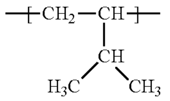

(15)

[Chem. 16]

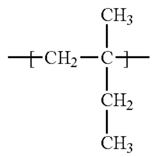

(16)

[Chem. 17]

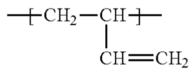

(17)

More specific examples of the structural unit represented by Formula (6) include structural units represented by the following Formulas (18) and (19). The structural unit represented by Formula (6) may be structures in which structural units represented by the following Formulas (18) and (19) are each repeated, and the like. The structural unit represented by Formula (6) may be one structural unit among these or a combination of two or more different structural units.

[Chem. 18]

$$-[CH_2-CH_2-CH_2-CH_2]- \quad (18)$$

[Chem. 19]

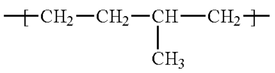

(19)

More specific examples of the structural unit represented by Formula (7) include structural units represented by the following Formulas (20) and (21). The structural unit represented by Formula (7) may be structures in which structural units represented by the following Formulas (20) and (21) are each repeated, and the like. The structural unit represented by Formula (7) may be one structural unit among these or a combination of two or more different structural units.

[Chem. 20]

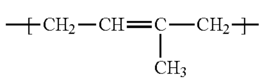

(20)

[Chem. 21]

$$-\!\!\!+CH_2-CH=CH-CH_2+\!\!\!-$$

(21)

Preferred examples of the styrenic copolymer include polymers or copolymers obtained by polymerizing or copolymerizing one or more styrenic monomers such as styrene, vinyltoluene, a-methylstyrene, isopropenyltoluene, divinylbenzene, or allylstyrene. More specific examples of the styrenic copolymer include a methylstyrene (ethylene/butylene)methylstyrene block copolymer, a methylstyrene (ethylene-ethylene/propylene)methylstyrene block copolymer, a styrene isoprene block copolymer, a styrene isoprene styrene block copolymer, a styrene (ethylene/butylene) styrene block copolymer, a styrene (ethylene-ethylene/propylene) styrene block copolymer, a styrene butadiene styrene block copolymer, a styrene (butadiene/butylene) styrene block copolymer, and a styrene isobutylene styrene block copolymer. Examples of the hydrogenated styrenic block copolymer include hydrogenated products of the styrenic block copolymers. More specific examples of the hydrogenated styrenic block copolymer include a hydrogenated methylstyrene (ethylene/butylene)methylstyrene block copolymer, a hydrogenated methylstyrene (ethylene-ethylene/propylene)methylstyrene block copolymer, a hydrogenated styrene isoprene block copolymer, a hydrogenated styrene isoprene styrene block copolymer, a hydrogenated styrene (ethylene/butylene) styrene block copolymer, and a hydrogenated styrene (ethylene-ethylene/propylene) styrene block copolymer.

As the styrenic polymer, the styrenic polymers exemplified above may be used singly or in combination of two or more kinds thereof.

The weight average molecular weight of the styrenic polymer is preferably 1,000 to 300,000, more preferably 1,200 to 200,000. When the molecular weight is too low, the glass transition temperature or heat resistance of the cured product of the resin composition tends to decrease. When the molecular weight is too high, the viscosity of the resin composition when prepared in the form of a varnish and the viscosity of the resin composition during heat molding tend to be too high. The weight average molecular weight is only required to be one measured by a general molecular weight measurement method, and specific examples thereof include a value measured by gel permeation chromatography (GPC).

As the styrenic polymer, a commercially available product can be used, and for example, V9827, V9461, 2002, and 7125F manufactured by Kuraray Co., Ltd., FTR2140 and FTR6125 manufactured by Mitsui Chemicals, Inc., and H1041 manufactured by Asahi Kasei Corporation may be used.

(Organic Component)

The resin composition according to the present embodiment may contain an organic component other than the maleimide compound (A) and the styrenic polymer, if necessary, as long as the effects of the present invention are not impaired. Here, the organic component may or may not react with at least one of the maleimide compound (A) and the styrenic polymer. Examples of the organic component include a maleimide compound (B) different from the maleimide compound (A), an epoxy compound, a methacrylate compound, an acrylate compound, a vinyl compound, a cyanate ester compound, an active ester compound, and an allyl compound.

The maleimide compound (B) is a maleimide compound that has a maleimide group in the molecule but does not have an arylene structure bonded in the meta-orientation in the molecule. Examples of the maleimide compound (B) include a maleimide compound having one or more maleimide groups in the molecule, and a modified maleimide compound. The maleimide compound (B) is not particularly limited as long as it is a maleimide compound that has one or more maleimide groups in the molecule but does not have an arylene structure bonded in the meta-orientation in the molecule. Examples of the maleimide compound (B) include phenylmaleimide compounds such as 4,4'-diphenylmethanebismaleimide, polyphenylmethanemaleimide, m-phenylenebismaleimide, bisphenol A diphenyl ether bismaleimide, 3,3'-dimethyl-5,5'-diethyl-4,4'-diphenylmethanebismaleimide, 4-methyl-1,3-phenylenebismaleimide, and a biphenylaralkyl type polymaleimide compound, and an N-alkyl bismaleimide compound having an aliphatic skeleton. Examples of the modified maleimide compound include a modified maleimide compound in which a part of the molecule is modified with an amine compound and a modified maleimide compound in which a part of the molecule is modified with a silicone compound. As the maleimide compound (B), a commercially available product can also be used, and for example, the solid component in MIR-3000-70MT manufactured by Nippon Kayaku Co., Ltd., BMI-4000 and BMI-5100 manufactured by Daiwa Kasei Industry Co., Ltd., and BMI-689, BMI-1500, and BMI-3000J manufactured by Designer Molecules Inc. may be used.

The epoxy compound is a compound having an epoxy group in the molecule, and specific examples thereof include a bisphenol type epoxy compound such as a bisphenol A type epoxy compound, a phenol novolac type epoxy compound, a cresol novolac type epoxy compound, a dicyclopentadiene type epoxy compound, a bisphenol A novolac type epoxy compound, a biphenylaralkyl type epoxy compound, and a naphthalene ring-containing epoxy compound. The epoxy compound also includes an epoxy resin, which is a polymer of each of the epoxy compounds.

The methacrylate compound is a compound having a methacryloyl group in the molecule, and examples thereof include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include dimethacrylate compounds such as tricyclodecanedimethanol dimethacrylate (DCP).

The acrylate compound is a compound having an acryloyl group in the molecule, and examples thereof include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include diacrylate compounds such as tricyclodecanedimethanol diacrylate.

The vinyl compound is a compound having a vinyl group in the molecule, and examples thereof include a monofunctional vinyl compound (monovinyl compound) having one vinyl group in the molecule and a polyfunctional vinyl compound having two or more vinyl groups in the molecule. Examples of the polyfunctional vinyl compound include divinylbenzene, a curable polybutadiene having a carbon-carbon unsaturated double bond in the molecule, a butadiene-styrene copolymer other than the styrenic polymer, a polyphenylene ether compound having a vinylbenzyl group (ethenylbenzyl group) at the terminal, and modified polyphenylene ether obtained by modifying the terminal hydroxyl group of polyphenylene ether with a methacryl group. Examples of the butadiene-styrene copolymer other than the styrenic polymer include a curable butadiene-styrene copolymer having a carbon-carbon unsaturated double bond in the molecule and being liquid at 25° C., a curable butadiene-styrene random copolymer having a carbon-carbon unsaturated double bond in the molecule, and a curable butadiene-styrene random copolymer having a carbon-carbon unsaturated double bond in the molecule and being liquid at 25° C.

The cyanate ester compound is a compound having a cyanato group in the molecule, and examples thereof include 2,2-bis(4-cyanatophenyl)propane, bis(3,5-dimethyl-4-cyanatophenyl)methane, and 2,2-bis(4-cyanatophenyl)ethane.

The active ester compound is a compound having an ester group exhibiting high reaction activity in the molecule, and examples thereof include a benzenecarboxylic acid active ester, a benzenedicarboxylic acid active ester, a benzenetricarboxylic acid active ester, a benzenetetracarboxylic acid active ester, a naphthalenecarboxylic acid active ester, a naphthalenedicarboxylic acid active ester, a naphthalenetricarboxylic acid active ester, a naphthalenetetracarboxylic acid active ester, a fluorenecarboxylic acid active ester, a fluorenedicarboxylic acid active ester, a fluorenetricarboxylic acid active ester, and a fluorenetetracarboxylic acid active ester.

The allyl compound is a compound having an allyl group in the molecule, and examples thereof include a triallyl isocyanurate compound such as triallyl isocyanurate (TRIC), a diallyl bisphenol compound, and diallyl phthalate (DAP).

As the organic component, the organic components described above may be used singly or in combination of two or more kinds thereof.

The weight average molecular weight of the organic component is not particularly limited, and is, for example, preferably 100 to 5000, more preferably 100 to 4000, still more preferably 100 to 3000. When the weight average molecular weight of the organic component is too low, there is a risk that the organic component easily volatilizes from the blended component system of the resin composition. When the weight average molecular weight of the organic component is too high, the viscosity of the varnish of the resin composition and the melt viscosity at the time of heat molding become too high, and there is a risk of deterioration in appearance and moldability when the resin composition is brought into B stage. Hence, a resin composition imparting superior heat resistance and moldability to its cured product is obtained when the weight average molecular weight of the organic component is in such a range. It is considered that this is because the resin composition can be suitably cured. Here, the weight average molecular weight may be measured by a general molecular weight measurement method, and specific examples thereof include a value measured by gel permeation chromatography (GPC).

In the organic component, the average number (number of functional groups) of the functional groups, which contribute to the reaction during curing of the resin composition, per one molecule of the organic component varies depending on the weight average molecular weight of the organic component but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

(Inorganic Filler)

The inorganic filler is not particularly limited as long as it is an inorganic filler that can be used as an inorganic filler contained in a resin composition. Examples of the inorganic filler include metal oxides such as silica, alumina, titanium oxide, magnesium oxide and mica, metal hydroxides such as magnesium hydroxide and aluminum hydroxide, talc, aluminum borate, barium sulfate, aluminum nitride, boron nitride, barium titanate, magnesium carbonate such as anhydrous magnesium carbonate, and calcium carbonate. Among these, silica, metal hydroxides such as magnesium hydroxide and aluminum hydroxide, aluminum oxide, boron nitride, and barium titanate are preferable, and silica is more preferable. The silica is not particularly limited, and examples thereof include crushed silica, spherical silica, and silica particles.

The inorganic filler may be an inorganic filler subjected to a surface treatment or an inorganic filler not subjected to a surface treatment. Examples of the surface treatment include treatment with a silane coupling agent.

Examples of the silane coupling agent include a silane coupling agent having at least one functional group selected from the group consisting of a vinyl group, a styryl group, a methacryloyl group, an acryloyl group, a phenylamino group, an isocyanurate group, a ureido group, a mercapto group, an isocyanate group, an epoxy group, and an acid anhydride group. In other words, examples of this silane coupling agent include compounds having at least one of a vinyl group, a styryl group, a methacryloyl group, an acryloyl group, a phenylamino group, an isocyanurate group, a ureido group, a mercapto group, an isocyanate group, an epoxy group, and an acid anhydride group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltriethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as those having a methacryloyl group. Examples of the silane coupling agent include 3-acryloxypropyltrimethoxysilane and 3-acryloxypropyltriethoxysilane as those having an acryloyl group. Examples of the silane coupling agent include N-phenyl-3-aminopropyltrimethoxysilane and N-phenyl-3-aminopropyltriethoxysilane as those having a phenylamino group.

The average particle size of the inorganic filler is not particularly limited, and is preferably 0.01 to 50 μm, more preferably 0.05 to 20 μm. Here, the average particle size refers to the volume average particle size. The volume average particle size can be measured by, for example, a laser diffraction method and the like.

(Content)

The content of the maleimide compound (A) is preferably 10 to 80 parts by mass, more preferably 15 to 75 parts by mass with respect to 100 parts by mass of the total mass of the maleimide compound (A) and the styrenic polymer. In other words, the content of the sty relic polymer is preferably 20 to 90 parts by mass, more preferably 25 to 85 parts by mass with respect to 100 parts by mass of the total mass of the maleimide compound (A) and the styrenic polymer. In a case where the resin composition contains the organic component, the content of the styrenic polymer is preferably 20 to 90 parts by mass, more preferably 25 to 85 parts by mass with respect to 100 parts by mass of the total mass of the maleimide compound (A), the styrenic polymer and the organic component. When the content of the maleimide compound (A) is too low, there is a tendency that the effect attained by addition of the maleimide compound (A) is unlikely to be exerted, and for example, excellent heat resistance is unlikely to be maintained. When the content of the maleimide compound (A) is too high, the adhesive properties to a metal foil tend to decrease. From these facts, when the content of each of the maleimide compound (A) and the styrenic polymer is in the above range, a cured product is more suitably obtained which exhibits excellent low dielectric properties and adhesive properties to a metal foil, has a high glass transition temperature, and sufficiently suppressed increases in relative dielectric constant and dielectric loss tangent due to temperature rise.

The resin composition may contain an inorganic filler as described above. In a case where the resin composition contains the inorganic filler, the content of the inorganic filler is preferably 1 to 250 parts by mass, more preferably 10 to 200 parts by mass with respect to 100 parts by mass of the total mass of the maleimide compound (A) and the styrenic polymer.

The resin composition may contain an organic component as described above. In a case where the resin composition contains the organic component, the content of the organic component is preferably 1 to 60 parts by mass, more preferably 1 to 55 parts by mass with respect to 100 parts by mass of the total mass of the maleimide compound (A), the styrenic polymer and the organic component.

(Other Components)

The resin composition according to the present embodiment may contain components (other components) other than the maleimide compound (A) and the styrenic polymer, if necessary, as long as the effects of the present invention are not impaired. As the other components contained in the resin composition according to the present embodiment, for example, additives such as a reaction initiator, a reaction accelerator, a catalyst, a polymerization retarder, a polymerization inhibitor, a dispersant, a leveling agent, a silane coupling agent, an antifoaming agent, an antioxidant, a heat stabilizer, an antistatic agent, an ultraviolet absorber, a dye or pigment, and a lubricant may be further contained in addition to an organic component and an inorganic filler as described above.

As described above, the resin composition according to the present embodiment may contain a reaction initiator. The reaction initiator is not particularly limited as long as it can promote the curing reaction of the resin composition, and examples thereof include a peroxide and an organic azo compound. Examples of the peroxide include α,α'-bis(t-butylperoxy-m-isopropyl)benzene, 2,5-dimethyl-2,5-di(t-butylperoxy)-3-hexyne, and benzoyl peroxide. Examples of the organic azo compound include azobisisobutyronitrile. A metal carboxylate can be concurrently used if necessary. By doing so, the curing reaction can be further promoted. Among these, α,α'-bis(t-butylperoxy-m-isopropyl)benzene is preferably used. α,α'-Bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in storage stability of the resin composition. α,α'-Bis(t-butylperoxy-m-isopropyl)benzene exhibits low volatility, thus does not volatilize at the time of prepreg drying and storage, and exhibits favorable stability. The reaction initiators may be used singly or in combination of two or more thereof.

As described above, the resin composition according to the present embodiment may contain a silane coupling agent. The silane coupling agent may be contained in the resin composition or may be contained as a silane coupling agent covered on the inorganic filler contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. In the case of a prepreg, the silane coupling agent may be contained in the prepreg as a silane coupling agent covered on the fibrous base material for surface treatment in advance. Examples of the silane coupling agent include those similar to the silane coupling agents used in the surface treatment of the inorganic filler described above.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and the decrease in heat resistance can be suppressed by the use of a halogen-based flame retardant. There is a case where a flame retardant containing phosphorus (phosphorus-based flame retardant) is used in fields required to be halogen-free. The phosphorus-based flame retardant is not particularly limited, and examples thereof include a phosphate ester-based flame retardant, a phosphazene-based flame retardant, a bis(diphenylphosphine oxide)-based flame retardant, and a phosphinate-based flame retardant. Specific examples of the phosphate ester-based flame retardant include a condensed phosphate ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as an aluminum dialkyl phosphinate. As the flame retardant, the respective flame retardants exemplified may be used singly or in combination of two or more kinds thereof.

(Production Method)

The method for producing the resin composition is not particularly limited, and examples thereof include a method in which the maleimide compound (A) and the styrenic polymer are mixed together so as to have predetermined contents. Examples thereof include the method to be described later in the case of obtaining a varnish-like composition containing an organic solvent.

Moreover, by using the resin composition according to the present embodiment, a prepreg, a metal-clad laminate, a wiring board, a metal foil with resin, and a film with resin can be obtained as described below.

[Prepreg]

FIG. 1 is a schematic sectional view illustrating an example of a prepreg 1 according to an embodiment of the present invention.

As illustrated in FIG. 1, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition has been cured to an extent that the resin composition can be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the resin composition in B stage) and a fibrous base material or a prepreg including the resin composition before being cured (the resin composition in A stage) and a fibrous base material. The resin composition or a semi-cured product of the resin composition may be one obtained by drying or heating and drying the resin composition.

When a prepreg is manufactured, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the respective components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the polyphenylene ether compound, the organic component and the like and does not inhibit the curing reaction. Specific examples thereof include toluene and methyl ethyl ketone (MEK).

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less. The glass fiber constituting the glass cloth is not particularly limited, and examples thereof include Q glass, NE glass, E glass, L glass, S glass, T glass, and L2 glass. The surface of the fibrous base material may be subjected to a surface treatment with a silane coupling agent. The silane coupling agent is not particularly limited, but examples thereof include a silane coupling agent having at least one selected from the group consisting of a vinyl group, an acryloyl group, a methacryloyl group, a styryl group, an amino group, and an epoxy group in the molecule.

The method for manufacturing the prepreg is not particularly limited as long as the prepreg can be manufactured. Specifically, when the prepreg is manufactured, the resin composition according to the present embodiment described above is often prepared in a varnish form and used as a resin varnish as described above.

Specific examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The resin composition according to the present embodiment is a resin composition that affords a cured product, which exhibits excellent low dielectric properties and adhesive properties to a metal foil, has a high glass transition temperature, and sufficiently suppressed increases in relative dielectric constant and dielectric loss tangent due to temperature rise. For this reason, a prepreg including this resin composition or a semi-cured product of this resin composition is a prepreg that affords a cured product, which exhibits excellent low dielectric properties and adhesive properties to a metal foil, has a high glass transition temperature, and sufficiently suppressed increases in relative dielectric constant and dielectric loss tangent due to temperature rise. By using this prepreg, it is possible to suitably manufacture a wiring board including an insulating layer containing a cured product, which exhibits excellent low dielectric properties and adhesive properties to a metal foil, has a high glass transition temperature, and sufficiently suppressed increases in relative dielectric constant and dielectric loss tangent due to temperature rise.

[Metal-Clad Laminate]

Figure 2:
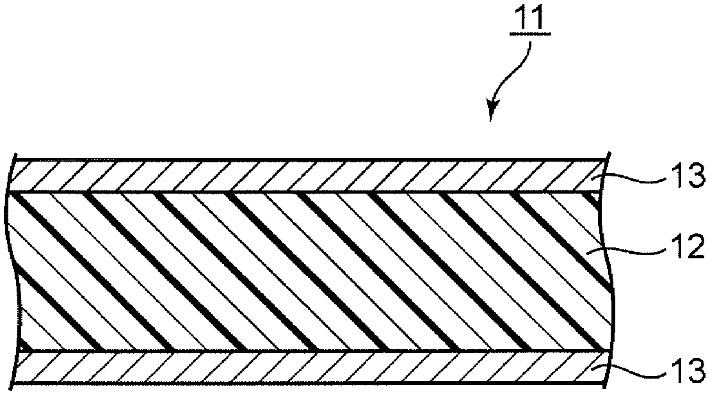
FIG. 2 is a schematic sectional view illustrating an example of a metal-clad laminate according to an embodiment of the present invention.

FIG. 2 is a schematic sectional view illustrating an example of a metal-clad laminate 11 according to an embodiment of the present invention.

As illustrated in FIG. 2, the metal-clad laminate 11 according to the present embodiment includes an insulating layer 12 containing a cured product of the resin composition and a metal foil 13 provided on the insulating layer 12. Examples of the metal-clad laminate 11 include a metal-clad laminate including an insulating layer 12 containing a cured product of the prepreg 1 illustrated in FIG. 1 and a metal foil 13 to be laminated together with the insulating layer 12. The insulating layer 12 may be formed of a cured product of the resin composition or a cured product of the prepreg. In addition, the thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 μm. Examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. The heating and pressing conditions can be appropriately set depending on the thickness of the metal-clad laminate 11, the kind of the resin composition contained in the prepreg 1, and the like. For example, it is possible to set the temperature to 170° C. to 220° C., the pressure to 3 to 4 MPa, and the time to 60 to 200 minutes. Moreover, the metal-clad laminate may be manufactured without using a prepreg. Examples thereof include a method in which a varnish-like resin composition is applied on a metal foil to form a layer containing the resin composition on the metal foil and then heating and pressing is performed.

The resin composition according to the present embodiment is a resin composition that affords a cured product, which exhibits excellent low dielectric properties and adhesive properties to a metal foil, has a high glass transition temperature, and sufficiently suppressed increases in relative dielectric constant and dielectric loss tangent due to temperature rise. For this reason, a metal-clad laminate including an insulating layer containing a cured product of this resin composition is a metal-clad laminate including an insulating layer containing a cured product, which exhibits excellent low dielectric properties and adhesive properties to a metal foil, has a high glass transition temperature, and sufficiently suppressed increases in relative dielectric constant and dielectric loss tangent due to temperature rise. By using this metal-clad laminate, it is possible to suitably manufacture a wiring board including an insulating layer containing a cured product, which exhibits excellent low dielectric properties and adhesive properties to a metal foil, has a high glass transition temperature, and sufficiently suppressed increases in relative dielectric constant and dielectric loss tangent due to temperature rise.

[Wiring Board]

Figure 3:
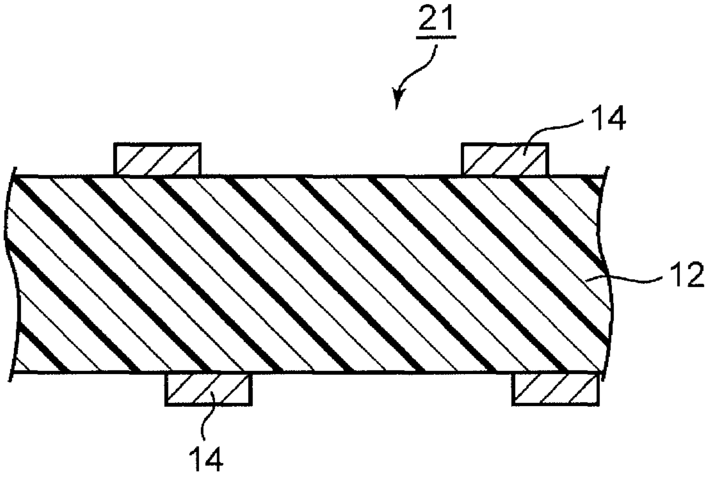
FIG. 3 is a schematic sectional view illustrating an example of a wiring board according to an embodiment of the present invention.

FIG. 3 is a schematic sectional view illustrating an example of a wiring board 21 according to an embodiment of the present invention.

As illustrated in FIG. 3, the wiring board 21 according to the present embodiment includes an insulating layer 12 containing a cured product of the resin composition and wiring 14 provided on the insulating layer 12. Examples of the wiring board 21 include a wiring board formed of an insulating layer 12 obtained by curing the prepreg 1 illustrated in FIG. 1 and wiring 14 which is laminated together with the insulating layer 12 and is formed by partially removing the metal foil 13. The insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 11 fabricated in the manner described above. In other words, the wiring board 21 is obtained by partially removing the metal foil 13 on the surface of the metal-clad laminate 11 and thus forming a circuit. Examples of the method for forming a circuit include circuit formation by a semi additive process (SAP) in addition to the method described above. The wiring board 21 is a wiring board including the insulating layer 12 containing a cured product, which exhibits excellent low dielectric properties and adhesive properties to a metal foil, has a high glass transition temperature, and sufficiently suppressed increases in relative dielectric constant and dielectric loss tangent due to temperature rise.

[Metal Foil with Resin]

Figure 4:
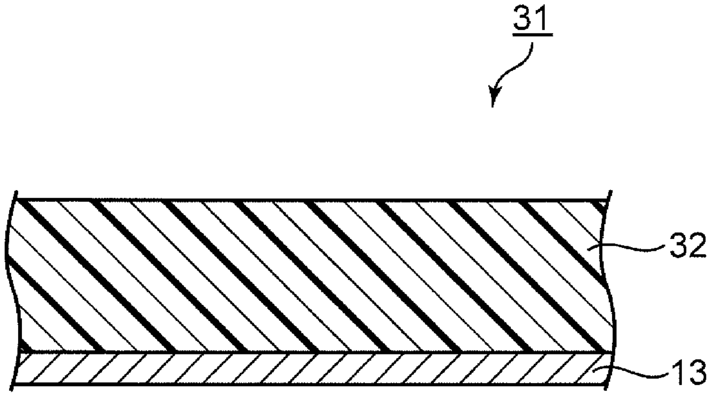
FIG. 4 is a schematic sectional view illustrating an example of a metal foil with resin according to an embodiment of the present invention.

FIG. 4 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 4. The metal foil with resin 31 includes the metal foil 13 on the surface of the resin layer 32. In other words, the metal foil with resin 31 includes the resin layer 32 and the metal foil 13 to be laminated together with the resin layer 32. The metal foil with resin 31 may include other layers between the resin layer 32 and the metal foil 13.

The resin layer 32 may contain a semi-cured product of the resin composition as described above or may contain the uncured resin composition. In other words, the metal foil with resin 31 may be a metal foil with resin including a resin layer containing a semi-cured product of the resin composition (the resin composition in B stage) and a metal foil or a metal foil with resin including a resin layer containing the resin composition before being cured (the resin composition in A stage) and a metal foil. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the metal foil, metal foils used in metal-clad laminates or metal foils with resin can be used without limitation. Examples of the metal foil include a copper foil and an aluminum foil.

The metal foil with resin 31 may include a cover film and the like if necessary. By including a cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of, for example, 80° C. or more and 180° C. or less and 1 minute or more and 10 minutes or less. The heated resin composition is formed as the uncured resin layer 32 on the metal foil 13. By the heating, the organic solvent can be decreased or removed by being volatilized from the resin varnish.

The resin composition according to the present embodiment is a resin composition that affords a cured product, which exhibits excellent low dielectric properties and adhesive properties to a metal foil, has a high glass transition temperature, and sufficiently suppressed increases in relative dielectric constant and dielectric loss tangent due to temperature rise. For this reason, a metal foil with resin including a resin layer containing this resin composition or a semi-cured product of this resin composition is a metal foil with resin including a resin layer that affords a cured product, which exhibits excellent low dielectric properties and adhesive properties to a metal foil, has a high glass transition temperature, and sufficiently suppressed increases in relative dielectric constant and dielectric loss tangent due to temperature rise. This metal foil with resin can be used in the manufacture of a wiring board including an insulating layer containing a cured product, which exhibits excellent low dielectric properties and adhesive properties to a metal foil, has a high glass transition temperature, and sufficiently suppressed increases in relative dielectric constant and dielectric loss tangent due to temperature rise. For example, by laminating the metal foil with resin on a wiring board, a multilayer wiring board can be manufactured. As a wiring board obtained using such a metal foil with resin, there is obtained a wiring board including an insulating layer containing a cured product, which exhibits excellent low dielectric properties and adhesive properties to a metal foil, has a high glass transition temperature, and sufficiently suppressed increases in relative dielectric constant and dielectric loss tangent due to temperature rise.

[Film with Resin]

Figure 5:
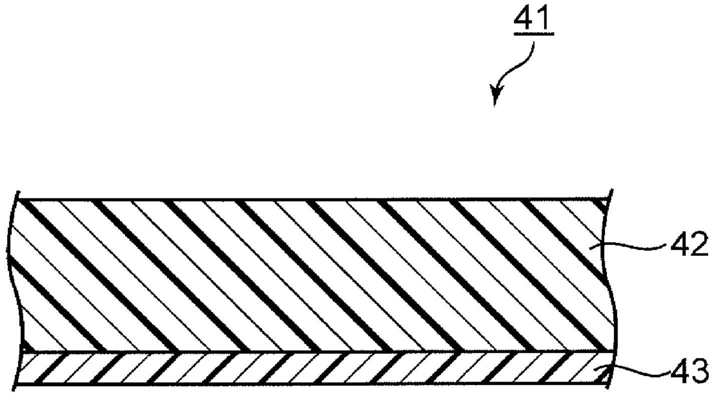
FIG. 5 is a schematic sectional view illustrating an example of a film with resin according to an embodiment of the present invention.

FIG. 5 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 5. The film with resin 41 includes the resin layer 42 and the support film 43 to be laminated together with the resin layer 42. The film with resin 41 may include other layers between the resin layer 42 and the support film 43.

The resin layer 42 may contain a semi-cured product of the resin composition as described above or may contain the uncured resin composition. In other words, the film with resin 41 may be a film with resin including a resin layer containing a semi-cured product of the resin composition (the resin composition in B stage) and a support film or a film with resin including a resin layer containing the resin composition before being cured (the resin composition in A stage) and a support film. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the support film 43, support films used in films with resin can be used without limitation. Examples of the support film include electrically insulating films such as a polyester film, a polyethylene terephthalate (PET) film, a polyimide film, a polyparabanic acid film, a polyether ether ketone film, a polyphenylene sulfide film, a polyamide film, a polycarbonate film, and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 80° C. or more and 180° C. or less and 1 minute or more and 10 minutes or less. The heated resin composition is formed as the uncured resin layer 42 on the support film 43. By the heating, the organic solvent can be decreased or removed by being volatilized from the resin varnish.

The resin composition according to the present embodiment is a resin composition that affords a cured product, which exhibits excellent low dielectric properties and adhesive properties to a metal foil, has a high glass transition temperature, and sufficiently suppressed increases in relative dielectric constant and dielectric loss tangent due to temperature rise. For this reason, a film with resin including a resin layer containing this resin composition or a semi-cured product of this resin composition is a film with resin including a resin layer that affords a cured product, which exhibits excellent low dielectric properties and adhesive properties to a metal foil, has a high glass transition temperature, and sufficiently suppressed increases in relative dielectric constant and dielectric loss tangent due to temperature rise. This film with resin can be used in suitable manufacture of a wiring board including an insulating layer containing a cured product, which exhibits excellent low dielectric properties and adhesive properties to a metal foil, has a high glass transition temperature, and sufficiently suppressed increases in relative dielectric constant and dielectric loss tangent due to temperature rise. A multilayer wiring board can be manufactured, for example, by laminating the film with resin on a wiring board and then peeling off the support film from the film with resin or by peeling off the support film from the film with resin and then laminating the film with resin on a wiring board. As a wiring board obtained using such a film with resin, there is obtained a wiring board including an insulating layer containing a cured product, which exhibits excellent low dielectric properties and adhesive properties to a metal foil, has a high glass transition temperature, and sufficiently suppressed increases in relative dielectric constant and dielectric loss tangent due to temperature rise.

According to the present invention, it is possible to provide a resin composition that affords a cured product, which exhibits excellent low dielectric properties and adhesive properties to a metal foil, has a high glass transition temperature, and sufficiently suppressed increases in relative dielectric constant and dielectric loss tangent due to temperature rise. In addition, according to the present invention, a prepreg, a film with resin, a metal foil with resin, a prepreg, a metal-clad laminate, and a wiring board which are obtained using the resin composition are provided.

Hereinafter, the present invention will be described more specifically with reference to examples, but the scope of the present invention is not limited thereto.

EXAMPLES

Examples 1 to 17 and Comparative Examples 1 to 9

The respective components to be used when preparing a resin composition in the present examples will be described.

(Maleimide Compound (A))

Maleimide compound (A): Maleimide compound having arylene structure bonded in meta-orientation in molecule (solid component in MIR-5000-60T (maleimide compound dissolved in toluene) manufactured by Nippon Kayaku Co., Ltd., maleimide compound (A2) represented by Formula (2))

(Styrenic Polymer)

Styrenic polymer-1: Hydrogenated methylstyrene (ethylene/butylene)methylstyrene block copolymer (V9827 manufactured by Kuraray Co., Ltd., weight average molecular weight Mw: 92,000, solid at 25° C.)

Styrenic polymer-2: Hydrogenated methylstyrene (ethylene/ethylene propylene)methylstyrene block copolymer (V9461 manufactured by Kuraray Co., Ltd., weight average molecular weight Mw: 240000, solid at 25° C.)

Styrenic polymer-3: Hydrogenated styrene (ethylene propylene) styrene block copolymer (2002 manufactured by Kuraray Co., Ltd., weight average molecular weight Mw: 54000, solid at 25° C.)

Styrenic polymer-4: Hydrogenated styrene isoprene styrene block copolymer (7125F manufactured by Kuraray Co., Ltd., weight average molecular weight Mw: 99000, number average molecular weight Mn: 82000, solid at 25° C.)

Styrenic polymer-5: Hydrogenated styrene (ethylene butylene) styrene block copolymer (H1041 manufactured by Asahi Kasei Corporation, weight average molecular weight Mw: 80000, solid at 25° C.)

Styrenic polymer-6: Styrene-(methylstyrene)-based block copolymer (FTR2140 manufactured by Mitsui Chemicals, Inc., weight average molecular weight Mw: 3230, solid at 25° C.)

Styrenic polymer-7: Styrenic polymer (FTR6125 manufactured by Mitsui Chemicals, Inc., weight average molecular weight Mw: 1950, number average molecular weight Mn: 1150, solid at 25° C.)

(Organic Component)

Maleimide compound (B)-1: Maleimide compound not having arylene structure bonded in meta-orientation in molecule (BMI-4000 manufactured by Daiwa Kasei Industry Co., Ltd.)

Maleimide compound (B)-2: Maleimide compound not having arylene structure bonded in meta-orientation in molecule (BMI-5100 manufactured by Daiwa Kasei Industry Co., Ltd.)

Maleimide compound (B)-3: Maleimide compound not having arylene structure bonded in meta-orientation in molecule (BMI-689 manufactured by Designer Molecules Inc., N-alkyl bismaleimide compound)

Maleimide compound (B)-4: Maleimide compound not having arylene structure bonded in meta-orientation in molecule (BMI-1500 manufactured by Designer Molecules Inc., N-alkyl bismaleimide compound)

Maleimide compound (B)-5: Maleimide compound not having arylene structure bonded in meta-orientation in molecule (BMI-3000J manufactured by Designer Molecules Inc.)

Epoxy compound: Dicyclopentadiene type epoxy resin (HP-7200 manufactured by DIC Corporation)

Vinyl compound-1: Liquid butadiene-styrene copolymer (Ricon 100 manufactured by CRAY VALLEY, liquid at 25° C.)

Vinyl compound-2: Compound represented by following Formula (22) (SD-5 manufactured by Sanko Co., Ltd.)

[Chem. 22]

(22)

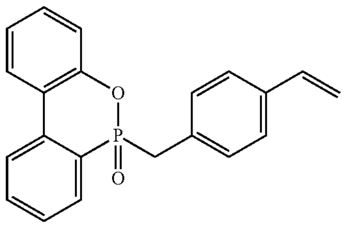

Vinyl compound-3: Modified polyphenylene ether obtained by modifying terminal hydroxyl group of polyphenylene ether with methacryl group (SA9000 manufactured by SABIC Innovative Plastics Co., Ltd., weight average molecular weight Mw: 2000)

Vinyl compound-4: Polyphenylene ether compound having vinylbenzyl group (ethenylbenzyl group) at terminal (OPE-2st 2200 manufactured by Mitsubishi Gas Chemical Company, Inc., number average molecular weight Mn: 2200)

Allyl compound: Triallyl isocyanurate (TAIL) (TRIC manufactured by Nihon Kasei CO., LTD.)

(Reaction Initiator)

PBP: α,α'-Di(t-butylperoxy)diisopropylbenzene (Perbutyl P (PBP) manufactured by NOF CORPORATION)

(Reaction Accelerator)

2E4MZ: 2-Ethyl-4-methylimidazole (2E4MZ manufactured by SHIKOKU CHEMICALS CORPORATION)

(Inorganic Filler)

Silica: Silica particles subjected to surface treatment with silane coupling agent having phenylamino group in molecule (SC2050-MTX manufactured by Admatechs Company Limited)

[Preparation Method]

First, the respective components other than the inorganic filler were added to and mixed in toluene at the compositions (parts by mass) presented in Tables 1 and 2 so that the solid concentration was 30% by mass. The mixture was stirred for 60 minutes. Thereafter, the filler was added to the obtained liquid, and the inorganic filler was dispersed in the liquid using a bead mill. By doing so, a varnish-like resin composition (varnish) was obtained.

Next, a metal foil with resin and an evaluation substrate (cured product of metal foil with resin) were obtained as follows.

The obtained varnish was applied to a copper foil (3EC-VLP manufactured by Mitsui Mining & Smelting Co., Ltd., thickness: 12 μm) to have a thickness of 50 μm, and dried by heating at 130° C. for 3 minutes, thereby fabricating a metal foil with resin (copper foil with resin). Thereafter, two sheets of each obtained metal foil with resin were stacked and heated to a temperature of 220° C. at a rate of temperature rise of 3° C./min and heated and pressed under the conditions of 220° C., 120 minutes, and a pressure of 3 MPa, thereby obtaining an evaluation substrate (cured product of metal foil with resin).

The metal foil with resin and evaluation substrates (cured product of metal foil with resin) fabricated as described above were evaluated by the following methods.

[Glass Transition Temperature (Tg)]

Using an unclad substrate obtained by removing the copper foil from the evaluation substrate (cured product of metal foil with resin) by etching as a test piece, the Tg of the cured product of the resin composition was measured by a viscoelastic spectrometer "DMS6100" manufactured by Seiko Instruments Inc. At this time, dynamic viscoelasticity measurement (DMA) was performed with a tensile module at a frequency of 10 Hz, and the temperature at which tan 6 was maximized when the temperature was raised from room temperature to 320° C. at a rate of temperature rise of 5° C./min was taken as Tg (° C.).

When the measured Tg is more than 300° C., it is denoted as ">300" in Table 1. When the measured Tg is less than 20° C., it is denoted as "<20" in Table 1.

[Coefficient of Thermal Expansion]

An unclad substrate obtained by removing the copper foil from the evaluation substrate (cured product of metal foil with resin) by etching was cut to have a length of 25 mm and a width of 5 mm. The cut unclad substrate was used as a test piece, and the dimensional change of the test piece was measured in a range of −70° C. to 320° C. at a probe distance of 15 mm and a tensile load of 50 mV using a TMA instrument (TMA6000 manufactured by SII NanoTechnology Inc.). From this dimensional change, the average coefficient of thermal expansion in the range of 30° C. to 260° C. was calculated, and this average coefficient of thermal expansion was taken as the coefficient of thermal expansion (CTE: ppm/° C.).

[Peel Strength]

The copper foil was peeled off from the evaluation substrate (cured product of metal foil with resin), and the peel strength at that time was measured in conformity with JIS C 6481 (1996). Specifically, a pattern having a width of 10 mm and a length of 100 mm was formed on the evaluation substrate, the copper foil was peeled off at a speed of 50 mm/min using a tensile tester, and the peel strength (N/mm) at that time was measured.

[Heat Resistance]

The evaluation substrates (cured products of metal foils with resin) were left in dryers at 280° C. and 290° C. for 1 hour, respectively. Thereafter, the presence or absence of blistering in the laminate after being left was visually observed. This observation was performed on two laminates. It was evaluated as "Very Good" when blistering was not confirmed (the number of blisters was 0) after being left in a dryer at 290° C. It was evaluated as "Good" when blistering was confirmed after being left in a dryer at 290° C. but blistering was not confirmed (the number of blisters was 0) after being left in a dryer at 280° C. It was evaluated as "Poor" when blistering was confirmed after being left in a dryer at 280° C.

[Dielectric Properties (Relative Dielectric Constant and Dielectric Loss Tangent) Before Heat Treatment]

The copper foil was removed from the evaluation substrate (cured product of metal foil with resin) by etching. The substrate thus obtained was used as a test piece, and the test piece was placed in a drier at 120° C. for 2 hours and dried to remove moisture in the test piece. The test piece taken out from the dryer was placed in a desiccator and returned to 25° C., and the relative dielectric constant (Dk) and dielectric loss tangent (Df) of the test piece were measured by the cavity perturbation method. Specifically, the relative dielectric constant (Dk) and dielectric loss tangent (Df) of the test piece before heat treatment at 10 GHz were measured using a network analyzer (N5230A manufactured by Agilent Technologies, Inc.).

[Dielectric properties (Relative Dielectric Constant and Dielectric Loss Tangent) After Heat Treatment]

The test piece used in the measurement of relative dielectric constant and dielectric loss tangent before heat treatment was left in a drier at 130° C. for 168 hours (one week) for heat treatment. The relative dielectric constant (Dk) and dielectric loss tangent (Df) of this test piece subjected to heat treatment were measured in the same manner as the measurement of relative dielectric constant and dielectric loss tangent before heat treatment.

[Amount of Change in Relative Dielectric Constant (After Heat Treatment−Before Heat Treatment)]

The difference between the relative dielectric constant before heat treatment and the relative dielectric constant after heat treatment (relative dielectric constant after heat treatment−relative dielectric constant before heat treatment) was calculated.

[Amount of Change in Dielectric Loss Tangent (After Heat Treatment−Before Heat Treatment)]

The difference between the dielectric loss tangent before heat treatment and the dielectric loss tangent after heat treatment (dielectric loss tangent after heat treatment−dielectric loss tangent before heat treatment) was calculated.

The results of each of the evaluations are presented in Tables 1 and 2. In a case where the varnish cannot be prepared, it is denoted as "−" in the evaluation.

TABLE 1

| | | | Example | | | | | | |
|---|---|---|---|---|---|---|---|---|---|
| | | | 1 | 2 | 3 | 4 | 5 | 6 | 7 |
| Composition (parts by mass) | Maleimide compound | Maleimide compound (A) | 50 | 50 | 50 | 50 | 50 | 50 | 50 |
| | Styrenic polymer | Styrenic polymer-1 | 50 | 50 | — | — | — | — | — |
| | | Styrenic polymer-2 | — | — | 50 | — | — | — | — |
| | | Styrenic polymer-3 | — | — | — | 50 | — | — | — |
| | | Styrenic polymer-4 | — | — | — | — | 50 | — | — |
| | | Styrenic polymer-5 | — | — | — | — | — | 50 | — |
| | | Styrenic polymer-6 | — | — | — | — | — | — | 50 |
| | | Styrenic polymer-7 | — | — | — | — | — | — | — |
| | Organic component | Maleimide compound (B)-1 | — | — | — | — | — | — | — |
| | | Maleimide compound (B)-2 | — | — | — | — | — | — | — |
| | | Maleimide compound (B)-3 | — | — | — | — | — | — | — |
| | | Vinyl compound-1 | — | — | — | — | — | — | — |
| | Reaction initiator | PBP | 1 | 1 | 1 | 1 | 1 | 1 | 1 |
| | Inorganic filler | Silica | — | 100 | 100 | 100 | 100 | 100 | 100 |
| Evaluation | Glass transition temperature Tg (° C.) | | 230 | 230 | 230 | 230 | 230 | 230 | 230 |
| | Coefficient of thermal expansion (ppm/° C.) | | 170 | 110 | 110 | 110 | 110 | 110 | 110 |
| | Peel strength (N/mm) | | 0.85 | 0.70 | 0.70 | 0.70 | 0.70 | 0.70 | 0.55 |
| | Heat resistance | | Good | Very Good | Very Good | Very Good | Very Good | Very Good | Very Good |
| | Before heat treatment | Relative dielectric constant | 2.25 | 2.35 | 2.35 | 2.35 | 2.35 | 2.35 | 2.35 |
| | | Dielectric loss tangent | 0.0023 | 0.0020 | 0.0020 | 0.0020 | 0.0020 | 0.0020 | 0.0020 |
| | After heat treatment | Relative dielectric constant | 2.25 | 2.35 | 2.35 | 2.35 | 2.35 | 2.35 | 2.35 |
| | | Dielectric loss tangent | 0.0023 | 0.0020 | 0.0020 | 0.0020 | 0.0020 | 0.0020 | 0.0020 |
| | Amount of change in relative dielectric constant (after heat treatment − before heat treatment) | | 0 | 0 | 0 | 0 | 0 | 0 | 0 |
| | Amount of change in dielectric loss tangent (after heat treatment − before heat treatment) | | 0 | 0 | 0 | 0 | 0 | 0 | 0 |

| | | | Example | Comparative Example | | | | | |
|---|---|---|---|---|---|---|---|---|---|
| | | | 8 | 1 | 2 | 3 | 4 | 5 | 6 |
| Composition (parts by mass) | Maleimide compound | Maleimide compound (A) | 50 | — | — | 50 | 100 | — | — |
| | Styrenic polymer | Styrenic polymer-1 | — | 50 | 50 | — | — | 100 | 50 |
| | | Styrenic polymer-2 | — | — | — | — | — | — | — |
| | | Styrenic polymer-3 | — | — | — | — | — | — | — |
| | | Styrenic polymer-4 | — | — | — | — | — | — | — |
| | | Styrenic polymer-5 | — | — | — | — | — | — | — |
| | | Styrenic polymer-6 | — | — | — | — | — | — | — |
| | | Styrenic polymer-7 | 50 | — | — | — | — | — | — |
| | Organic component | Maleimide compound (B)-1 | — | 50 | — | — | — | — | — |
| | | Maleimide compound (B)-2 | — | — | 50 | — | — | — | — |
| | | Maleimide compound (B)-3 | — | — | — | — | — | — | 50 |
| | | Vinyl compound-1 | — | — | — | 50 | — | — | — |
| | Reaction initiator | PBP | 1 | 1 | 1 | 1 | 1 | — | 1 |
| | Inorganic filler | Silica | 100 | 100 | 100 | 100 | 100 | 100 | 100 |
| Evaluation | Glass transition temperature Tg (° C.) | | 230 | — | — | 210 | >300 | <20 | 120 |
| | Coefficient of thermal expansion (ppm/° C.) | | 100 | | | 95 | 50 | 150 | 170 |
| | Peel strength (N/mm) | | 0.55 | | | 0.50 | 0.55 | 1.10 | 1.20 |
| | Heat resistance | | Very Good | | | Good | Very Good | Poor | Very Good |
| | Before heat treatment | Relative dielectric constant | 2.35 | | | 2.35 | 2.98 | 2.30 | 2.30 |
| | | Dielectric loss tangent | 0.0020 | | | 0.0020 | 0.0039 | 0.0018 | 0.0020 |
| | After heat treatment | Relative dielectric constant | 2.35 | | | 2.42 | 2.98 | 2.30 | 2.30 |
| | | Dielectric loss tangent | 0.0020 | | | 0.0025 | 0.0039 | 0.0018 | 0.0020 |
| | Amount of change in relative dielectric constant (after heat treatment − before heat treatment) | | 0 | | | 0.07 | 0 | 0 | 0 |
| | Amount of change in dielectric loss tangent (after heat treatment − before heat treatment) | | 0 | | | 0.0005 | 0 | 0 | 0 |

TABLE 2

| | | | Example 9 | Example 10 | Example 11 | Example 12 | Example 13 | Example 14 |
|---|---|---|---|---|---|---|---|---|
| Composition (parts by mass) | Maleimide compound | Maleimide compound (A) | 10 | 60 | 80 | 50 | 40 | 40 |
| | Styrenic polymer | Styrenic polymer-1 | 90 | 40 | 20 | 50 | 50 | 50 |
| | Organic component | Maleimide compound (B)-4 | — | — | — | — | 10 | — |
| | | Maleimide compound (B)-5 | — | — | — | — | — | 10 |
| | | Epoxy compound | — | — | — | — | — | — |
| | | Vinyl compound-1 | — | — | — | — | — | — |
| | | Vinyl compound-2 | — | — | — | — | — | — |
| | | Vinyl compound-3 | — | — | — | — | — | — |
| | | Vinyl compound-4 | — | — | — | — | — | — |
| | | Allyl compound | — | — | — | — | — | — |
| | Reaction initiator | PBP | 1 | 1 | 1 | 1 | 1 | 1 |
| | Reaction accelerator | 2E4MZ | — | — | — | — | — | — |
| | Inorganic filler | Silica | 100 | 100 | 100 | 200 | 100 | 100 |
| Evaluation | Glass transition temperature Tg (° C.) | | 225 | 232 | 245 | 225 | 220 | 220 |
| | Coefficient of thermal expansion (ppm/° C.) | | 150 | 55 | 50 | 80 | 120 | 120 |
| | Peel strength (N/mm) | | 0.90 | 0.70 | 0.60 | 0.55 | 0.75 | 0.75 |
| | Heat resistance | | Good | Very Good | Very Good | Very Good | Very Good | Very Good |
| | Before heat treatment | Relative dielectric constant | 2.25 | 2.73 | 2.78 | 2.65 | 2.28 | 2.28 |
| | | Dielectric loss tangent | 0.0018 | 0.0023 | 0.0028 | 0.0018 | 0.0020 | 0.0020 |
| | After heat treatment | Relative dielectric constant | 2.25 | 2.73 | 2.78 | 2.65 | 2.28 | 2.28 |
| | | Dielectric loss tangent | 0.0018 | 0.0023 | 0.0028 | 0.0018 | 0.0020 | 0.0020 |
| | Amount of change in relative dielectric constant (after heat treatment − before heat treatment) | | 0 | 0 | 0 | 0 | 0 | 0 |
| | Amount of change in dielectric loss tangent (after heat treatment − before heat treatment) | | 0 | 0 | 0 | 0 | 0 | 0 |

| | | | Example 15 | Example 16 | Example 17 | Comparative Example 7 | Comparative Example 8 | Comparative Example 9 |
|---|---|---|---|---|---|---|---|---|
| Composition (parts by mass) | Maleimide compound | Maleimide compound (A) | 40 | 40 | 40 | — | — | — |
| | Styrenic polymer | Styrenic polymer-1 | 50 | 50 | 50 | 50 | 50 | 50 |
| | Organic component | Maleimide compound (B)-4 | — | — | — | — | — | — |
| | | Maleimide compound (B)-5 | — | — | — | — | — | — |
| | | Epoxy compound | 10 | — | — | 50 | — | — |
| | | Vinyl compound-1 | — | — | — | — | — | — |
| | | Vinyl compound-2 | — | 10 | — | — | — | — |
| | | Vinyl compound-3 | — | — | 10 | — | 30 | — |
| | | Vinyl compound-4 | — | — | — | — | — | 50 |
| | | Allyl compound | — | — | — | — | 20 | — |
| | Reaction initiator | PBP | 1 | 1 | 1 | — | 1 | 1 |
| | Reaction accelerator | 2E4MZ | 0.05 | 0.05 | — | 1 | — | — |
| | Inorganic filler | Silica | 100 | 100 | 100 | 100 | 100 | 100 |
| Evaluation | Glass transition temperature Tg (° C.) | | 220 | 220 | 220 | 210 | 190 | 200 |
| | Coefficient of thermal expansion (ppm/° C.) | | 100 | 110 | 100 | 120 | 110 | 110 |
| | Peel strength (N/mm) | | 0.75 | 0.55 | 0.60 | 0.90 | 0.70 | 0.70 |
| | Heat resistance | | Very Good | Very Good | Very Good | Very Good | Very Good | Very Good |
| | Before heat treatment | Relative dielectric constant | 2.45 | 2.60 | 2.40 | 3.30 | 2.72 | 2.60 |
| | | Dielectric loss tangent | 0.0025 | 0.0023 | 0.0024 | 0.0075 | 0.0042 | 0.0025 |
| | After heat treatment | Relative dielectric constant | 2.45 | 2.60 | 2.41 | 3.30 | 2.74 | 2.70 |
| | | Dielectric loss tangent | 0.0025 | 0.0023 | 0.0025 | 0.0075 | 0.0045 | 0.0031 |
| | Amount of change in relative dielectric constant (after heat treatment − before heat treatment) | | 0 | 0 | 0.01 | 0 | 0.02 | 0.10 |
| | Amount of change in dielectric loss tangent (after heat treatment − before heat treatment) | | 0 | 0 | 0.0001 | 0 | 0.0003 | 0.0006 |

As can be seen from Tables 1 and 2, in resin compositions containing a styrenic polymer being solid at 25° C., in the case of using resin compositions (Examples 1 to 17) containing a maleimide compound having an arylene structure bonded in the meta-orientation in the molecule (maleimide compound (A)), cured products were obtained which had a higher glass transition temperature and a higher peel strength and had not only a lower relative dielectric constant and a lower dielectric loss tangent but also smaller amounts of change in the relative dielectric constant and dielectric loss tangent after heat treatment as compared to the case of not using these resin compositions. Specifically, it was not possible to suitably produce varnishes of the resin compositions according to Comparative Examples 1 and 2, which were the same as the resin composition according to Example 2 except that the resin compositions contained the maleimide compound (B) [(B)-1 or (B)-2] not having an arylene structure bonded in the meta-orientation in the molecule instead of the maleimide compound (A) as a maleimide compound. In the case (Comparative Example 6) of using the maleimide compound (B)-3 not having an arylene structure bonded in the meta-orientation in the molecule as well, it was possible to produce a varnish depending on the maleimide compound. The cured product obtained using the resin composition according to Example 2 had a higher glass transition temperature and a higher peel strength as compared to the cured product obtained using such a resin composition according to Comparative Example 6. The cured product obtained using the resin composition according to Example 2 had a higher peel strength, a lower relative dielectric constant and a lower dielectric loss tangent as compared to the cured product obtained using the resin composition according to Comparative Example 4, which was the same as the resin composition according to Example 2 except that the resin composition did not contain the styrenic polymer. The cured product obtained using the resin composition according to Example 2 had a higher glass transition temperature and a lower relative dielectric constant and a lower dielectric loss tangent or smaller amounts of change in the relative dielectric constant and dielectric loss tangent after heat treatment as compared to the case of not containing the styrenic polymer but containing an organic component instead (Comparative Example 3 and Comparative Examples 7 to 9). The cured product obtained using the resin composition according to Example 2 had not only lower heat resistance such as a lower glass transition temperature but also a lower coefficient of thermal expansion as compared to the cure product obtained using the resin composition not containing a maleimide compound according to Comparative Example 5. From these facts, it has been found that the resin compositions according to Examples 1 to 17 afford cured products, which exhibit excellent low dielectric properties and adhesive properties to a metal foil, has a high glass transition temperature, and sufficiently suppressed increases in relative dielectric constant and dielectric loss tangent due to temperature rise. From Tables 1 and 2, it has been found that a cured product, which exhibits excellent low dielectric properties and adhesive properties to a metal foil, has a high glass transition temperature, and sufficiently suppressed increases in relative dielectric constant and dielectric loss tangent due to temperature rise, is obtained when the kind of styrenic polymer is changed, the content of the maleimide compound (A) is changed, or an organic component is further contained as well.

This application is based on Japanese Patent Application No. 2020-153179 filed on Sep. 11, 2020, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there is provided a resin composition that affords a cured product, which exhibits excellent low dielectric properties and adhesive properties to a metal foil, has a high glass transition temperature, and sufficiently suppressed increases in relative dielectric constant and dielectric loss tangent due to temperature rise. In addition, according to the present invention, a prepreg, a film with resin, a metal foil with resin, a metal-clad laminate, and a wiring board which are obtained using the resin composition are provided.

The invention claimed is:

1. A resin composition comprising:

a maleimide compound (A) having an arylene structure bonded in meta-orientation in a molecule; and a styrenic polymer being solid at 25° C., wherein the weight average molecular weight of the styrenic polymer is 54,000 to 92,000.

2. The resin composition according to claim 1, wherein the maleimide compound (A) includes a maleimide compound (A1) represented by the following Formula (1):

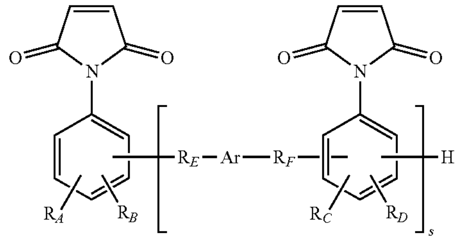

(1)

wherein in Formula (1), Ar represents an arylene group bonded in meta-orientation, $R_A$, $R_B$, $R_C$, and $R_D$ each independently represent a hydrogen atom, an alkyl group having 1 to 5 carbon atoms, or a phenyl group, $R_E$ and $R_F$ each independently represent an aliphatic hydrocarbon group, and s represents 1 to 5.

3. The resin composition according to claim 2, wherein the maleimide compound (A1) represented by Formula (1) includes a maleimide compound (A2) represented by the following Formula (2):

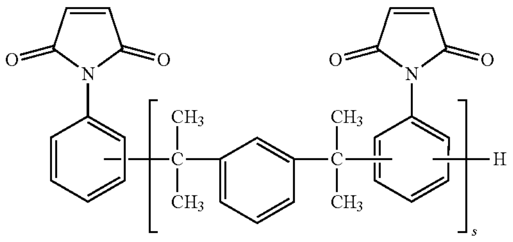

(2)

wherein in Formula (2), s represents 1 to 5.

4. The resin composition according to claim 1, the styrenic polymer includes a hydrogenated styrenic copolymer.

5. The resin composition according to claim 4, wherein the hydrogenated styrenic copolymer includes at least one selected from the group consisting of a hydrogenated methylstyrene (ethylene/butylene)methylstyrene block copolymer, a hydrogenated methylstyrene (ethylene-ethylene/propylene)methylstyrene block copolymer, a hydrogenated styrene isoprene block copolymer, a hydrogenated styrene isoprene styrene block copolymer, a hydrogenated styrene (ethylene/butylene) styrene block copolymer, and a hydrogenated styrene (ethylene-ethylene/propylene) styrene block copolymer.

6. The resin composition according to claim 1, wherein a content of the maleimide compound (A) is 10 to 80 parts by mass with respect to 100 parts by mass of a total mass of the maleimide compound (A) and the styrenic polymer.

7. The resin composition according to claim 1, further comprising an organic component other than the maleimide compound (A) and the styrenic polymer, wherein the organic component includes at least one selected from a maleimide compound (B) different from the maleimide compound (A), an epoxy compound, a methacrylate compound, an acrylate compound, a vinyl compound, a cyanate ester compound, an active ester compound, and an allyl compound.

8. The resin composition according to claim 1, further comprising an inorganic filler.

9. The resin composition according to claim 8, wherein a content of the inorganic filler is 1 to 250 parts by mass with respect to 100 parts by mass of a total mass of the maleimide compound (A) and the styrenic polymer.

10. The resin composition according to claim 7, wherein a content of the styrenic polymer is 20 to 90 parts by mass with respect to 100 parts by mass of a total mass of the maleimide compound (A), the styrenic polymer, and the organic component.

11. The resin composition according to claim 7, wherein a content of the organic component is 1 to 60 parts by mass with respect to 100 parts by mass of a total mass of the maleimide compound (A), the styrenic polymer, and the organic component.

12. A prepreg comprising:

the resin composition according to claim 1 or a semi-cured product of the resin composition; and a fibrous base material.

13. A film with resin comprising:

a resin layer containing the resin composition according to claim 1 or a semi-cured product of the resin composition; and a support film.

14. A metal foil with resin comprising:

a resin layer containing the resin composition according to claim 1 or a semi-cured product of the resin composition; and a metal foil.

15. A metal-clad laminate comprising:

an insulating layer containing a cured product of the resin composition according to claim 1; and a metal foil.

16. A wiring board comprising:

an insulating layer containing a cured product of the resin composition according to claim 1; and wiring.

17. A metal-clad laminate comprising:

an insulating layer containing a cured product of the prepreg according to claim 12; and a metal foil.

18. A wiring board comprising:

an insulating layer containing a cured product of the prepreg according to claim 12; and wiring.

* * * * *